(12) United States Patent
Lin et al.

(10) Patent No.: US 9,543,408 B1
(45) Date of Patent: Jan. 10, 2017

(54) METHOD OF FORMING PATTERNED HARD MASK LAYER

(71) Applicant: UNITED MICROELECTRONICS CORP., Hsin-Chu (TW)

(72) Inventors: Yi-Hui Lin, Changhua County (TW); Keng-Jen Lin, Kaohsiung (TW); Chun-Yao Yang, Kaohsiung (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/835,730

(22) Filed: Aug. 26, 2015

(51) Int. Cl.
| | |
|---|---|
| H01L 21/3205 | (2006.01) |
| H01L 29/66 | (2006.01) |
| H01L 21/02 | (2006.01) |
| H01L 21/265 | (2006.01) |
| H01L 21/324 | (2006.01) |
| H01L 21/3213 | (2006.01) |
| H01L 21/3215 | (2006.01) |

(52) U.S. Cl.
CPC ... *H01L 29/66545* (2013.01); *H01L 21/02532* (2013.01); *H01L 21/02592* (2013.01); *H01L 21/26513* (2013.01); *H01L 21/324* (2013.01); *H01L 21/32055* (2013.01); *H01L 21/32139* (2013.01); *H01L 21/32155* (2013.01); *H01L 29/66795* (2013.01)

(58) Field of Classification Search
CPC ............ H01L 21/02592; H01L 21/02532; H01L 21/0257; H01L 21/02675; H01L 21/02686; H01L 21/0268; H01L 29/66409; H01L 23/544; G03F 9/7084
See application file for complete search history.

(56) References Cited

U.S. PATENT DOCUMENTS

| | | | |
|---|---|---|---|
| 6,008,098 A * | 12/1999 | Pramanick | ........ H01L 21/26506 257/E21.335 |
| 8,111,376 B2 | 2/2012 | Adel | |
| 8,188,447 B2 | 5/2012 | Yang | |
| 2003/0042484 A1* | 3/2003 | Horikoshi | ........... H01L 29/4908 257/48 |
| 2008/0316442 A1 | 12/2008 | Adel | |
| 2012/0190216 A1* | 7/2012 | Chan | ................. H01L 21/82341 438/799 |
| 2014/0356982 A1 | 12/2014 | Barash | |
| 2015/0060970 A1* | 3/2015 | Sasaki | ............... H01L 27/10855 257/296 |
| 2015/0270373 A1* | 9/2015 | Horak | ............... H01L 29/66545 257/401 |
| 2016/0181381 A1* | 6/2016 | Liu | .................. H01L 29/41783 257/401 |

* cited by examiner

*Primary Examiner* — Zandra Smith
*Assistant Examiner* — Evan Clinton
(74) *Attorney, Agent, or Firm* — Winston Hsu; Scott Margo

(57) ABSTRACT

A method of forming a patterned hark mask layer includes the following steps. A semiconductor substrate is provided. An amorphous silicon layer is formed on the semiconductor substrate. An implantation process is performed on the amorphous silicon layer. An annealing treatment is performed on the amorphous silicon layer after the implantation process. A patterned hard mask layer is formed on the amorphous silicon layer after the annealing treatment.

12 Claims, 5 Drawing Sheets

METHOD OF FORMING PATTERNED HARD MASK LAYER

BACKGROUND OF THE INVENTION

1. Field of the Invention

The present invention relates to a method of forming a patterned hard mask layer, and more particularly, to a method of forming a patterned hard mask layer on an amorphous silicon layer with improved alignment accuracy.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly. Photolithography technology is used to form patterned structures in general semiconductor manufacturing processes. The size and the spacing between the patterned structures are limited by the exposure resolution minimum of the traditional photolithography technology and hard to be further shrunk. Therefore, many approaches such as the sidewall image transfer (SIT) technology and the multiple patterning have been provided by the related industries for forming patterned structures in the advanced manufacturing process. However, there are more layers stacked before the lithography process applying the SIT technology, and it becomes more difficult to measure alignment marks under the stacked layers. The alignment accuracy may be seriously influenced accordingly.

SUMMARY OF THE INVENTION

It is one of the objectives of the present invention to provide a method of forming a patterned hard mask layer. In the method of the present invention, grain size distribution of an amorphous silicon layer becomes more uniform after an implantation process and an annealing treatment performed on the amorphous silicon layer. Measurements of alignment marks under the amorphous silicon layer may become easier and more precise, and the alignment accuracy of the subsequent lithography processes may be improved accordingly.

A method of forming a patterned hard mask layer is provided in an embodiment of the present invention. The method includes the following steps. A semiconductor substrate is provided. An amorphous silicon layer is formed on the semiconductor substrate. An implantation process is performed on the amorphous silicon layer. An annealing treatment is performed on the amorphous silicon layer after the implantation process. A patterned hard mask layer is formed on the amorphous silicon layer after the annealing treatment.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-7 are schematic drawings illustrating a method of forming a patterned hard mask layer according to an embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

DETAILED DESCRIPTION

Figure 1:
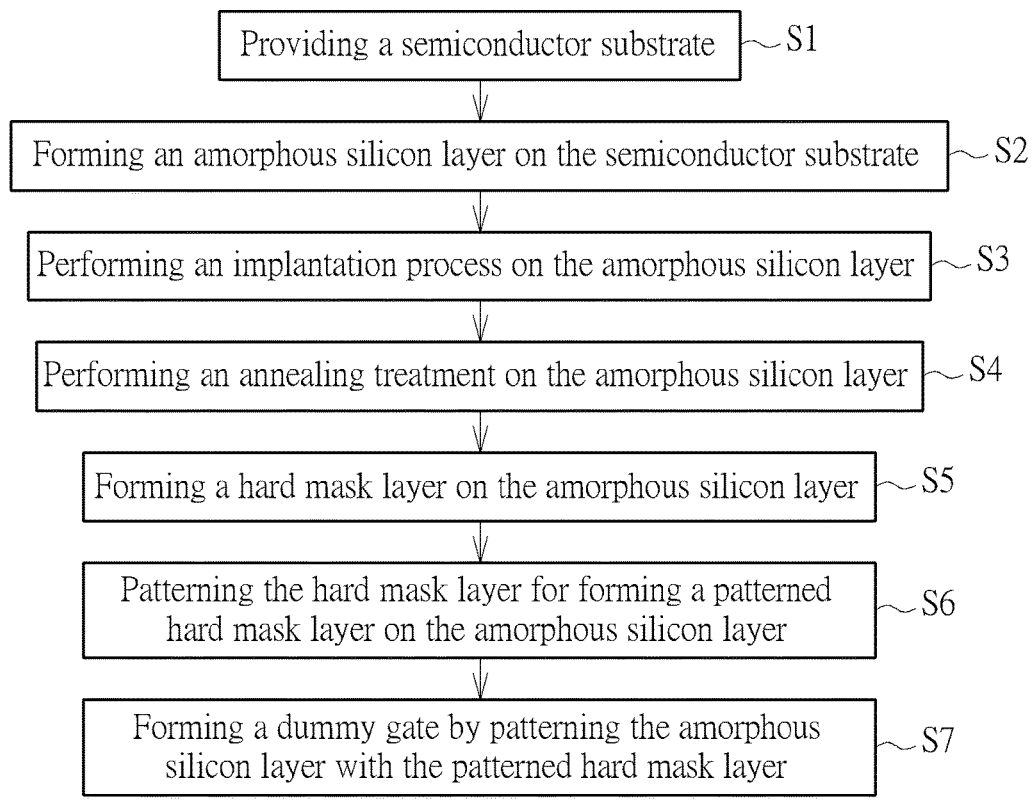
FIG. 1 is a flow chart of a method of forming a patterned hard mask layer according to an embodiment of the present invention.
Figure 2:
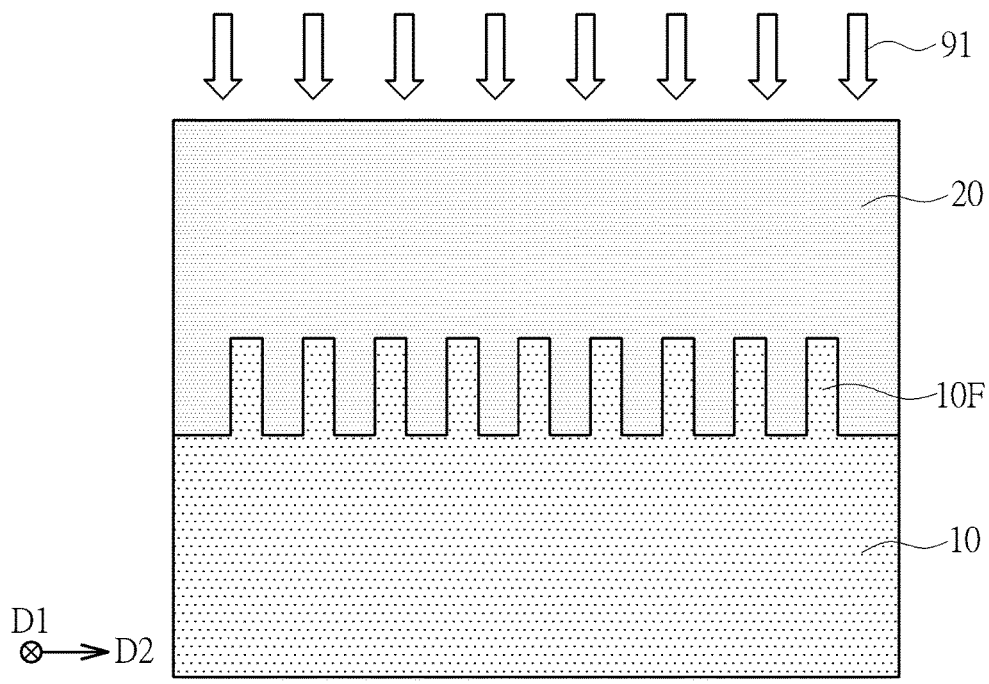
Figure 3:
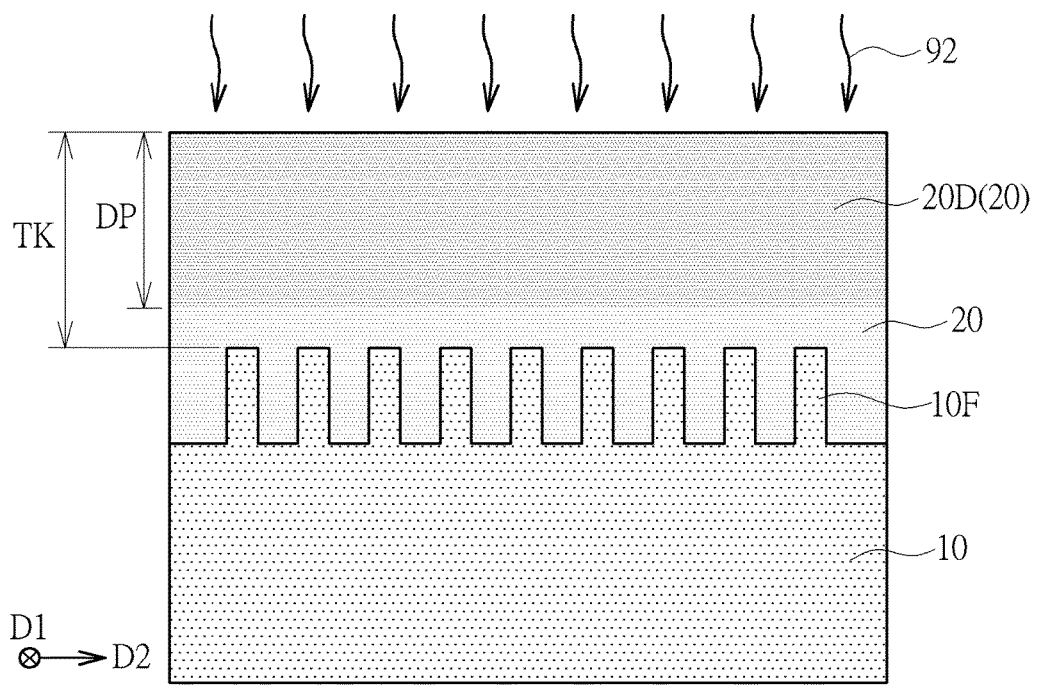
Figure 4:
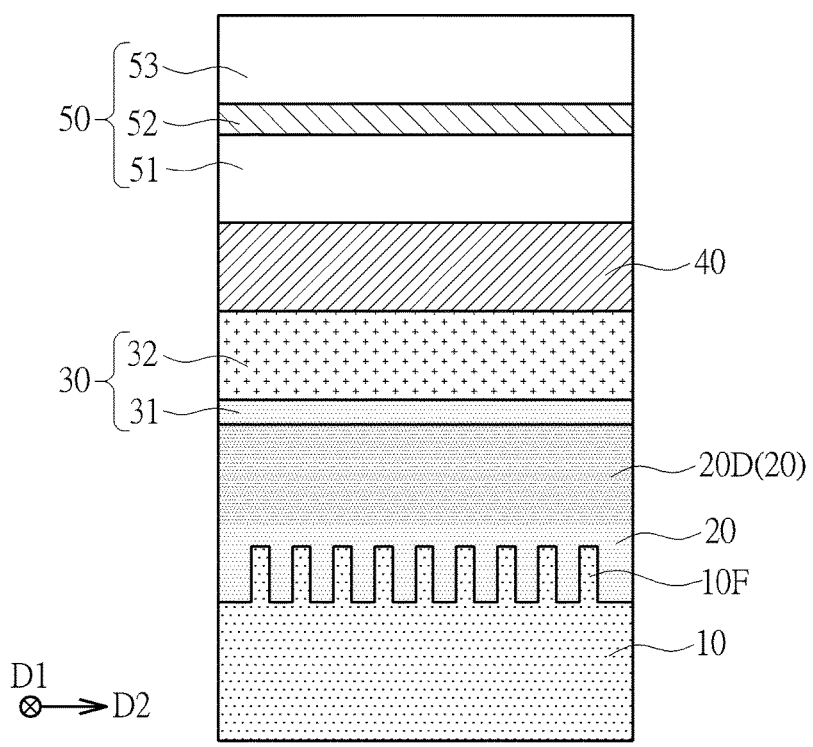
Figure 5:
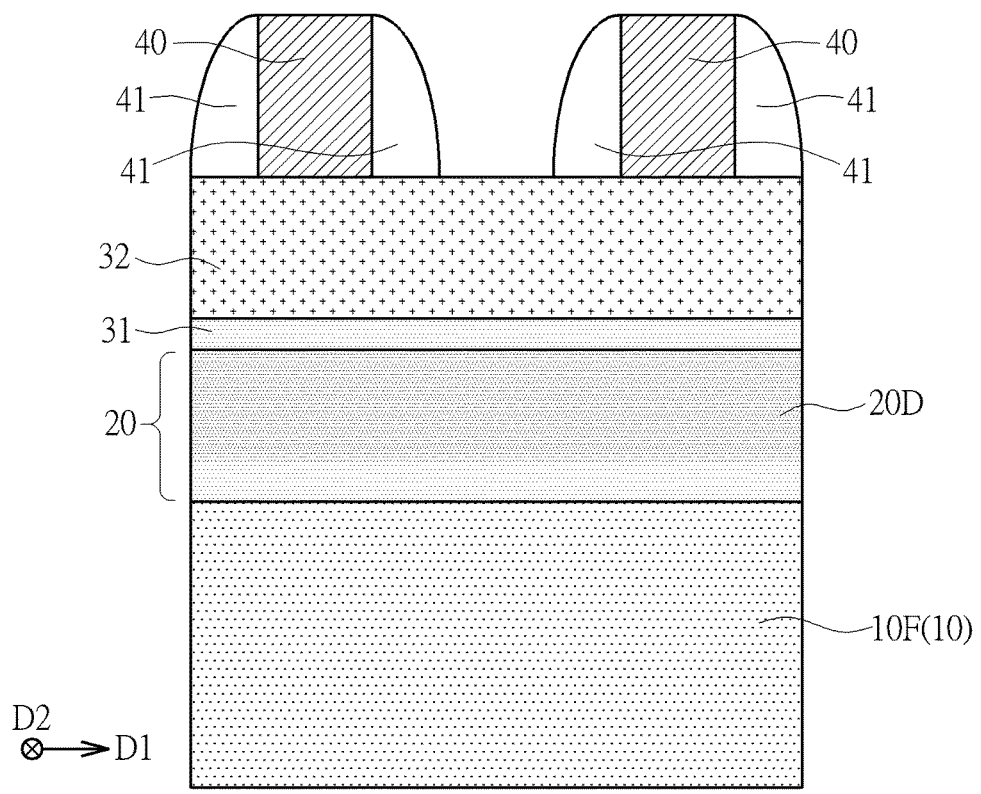
Figure 6:
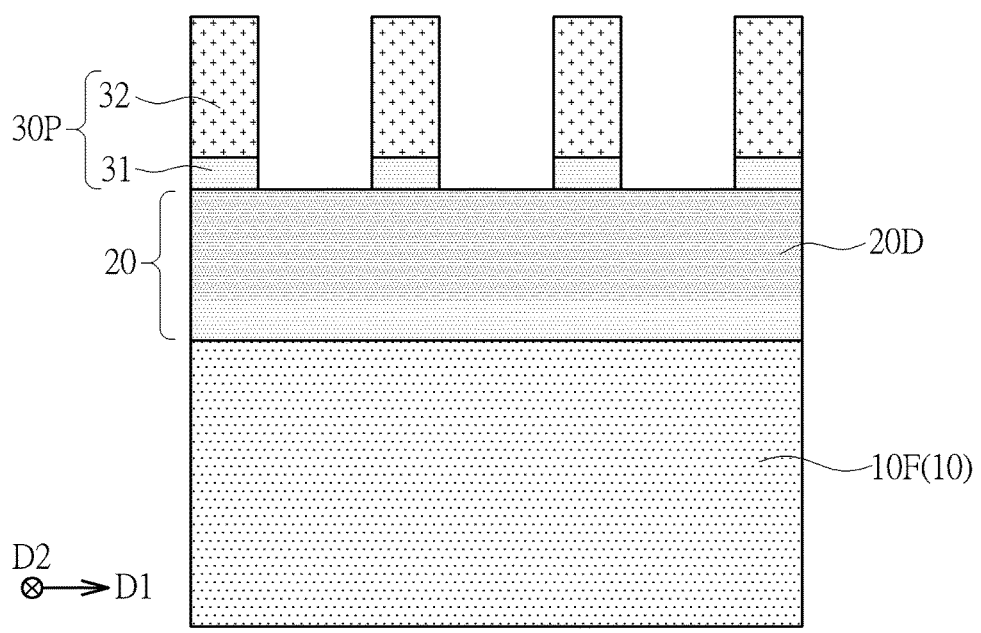
Figure 7:
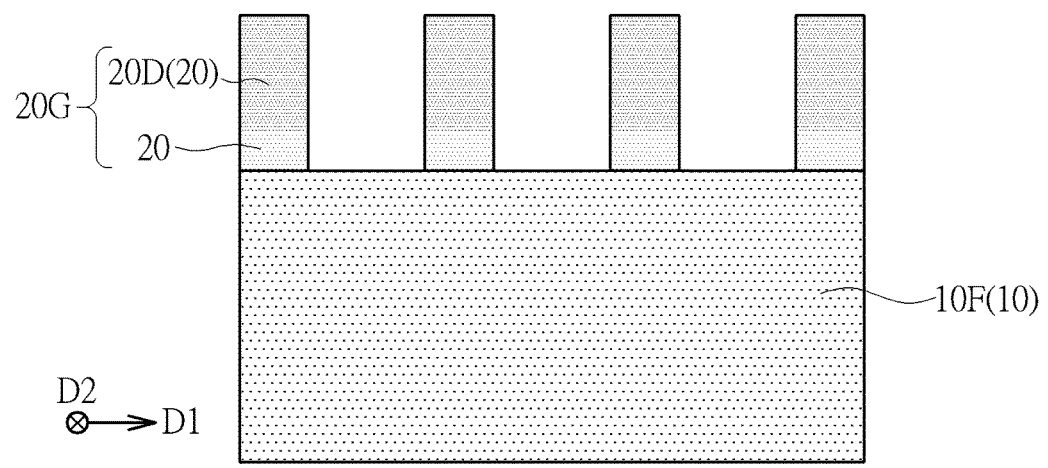

Please refer to FIGS. 1-7. FIG. 1 is a flow chart of a method of forming a patterned hard mask layer according to an embodiment of the present invention. FIGS. 2-7 are schematic drawings illustrating the method in this embodiment. FIGS. 2-4 are figures taken in a second direction D2, and FIGS. 5-7 are figures taken in a first direction D1 perpendicular to the second direction D2. The method of forming the patterned hard mask layer in this embodiment includes the following steps. As shown in FIG. 1 and FIG. 2, in step S1, a semiconductor substrate 10 is provided. The semiconductor substrate 10 may include a silicon substrate, an epitaxial silicon substrate, a silicon germanium substrate, a silicon carbide substrate, or a silicon-on-insulator (SOI) substrate, but not limited thereto. In this embodiment, the semiconductor substrate 10 may include a plurality of fins 10F protruding upward, extending in the first direction D1, and repeatedly arranged in a second direction D2, but not limited thereto. The fins 10F may be formed by appropriate processes such as a double patterning process, a multiple patterning process, or a sidewall image transfer (SIT) process, but not limited thereto. In step S2, an amorphous silicon layer 20 is then formed on the semiconductor substrate 10. In this embodiment, the amorphous silicon layer 20 is formed on the fins 10F, but not limited thereto. The amorphous silicon layer 20 may be formed by chemical vapor deposition (CVD) or other suitable technique. Before the step of forming the amorphous silicon layer 20, a shallow trench isolation (not shown) may be selectively formed between the fins 10F, and a gate dielectric layer may be selectively formed on the fins 10F, but not limited thereto. Subsequently, in step S3, an implantation process 91 is performed on the amorphous silicon layer 20. In this embodiment, the implantation process 91 may include a boron implantation process, a germanium implantation process, an arsenic implantation process, a phosphorous implantation process, or implantation processes applying other suitable dopants. Ion energy of the implantation process 91 may range between 13 kV and 40 kV, and an ion dose of the implantation process 91 may range between $1.0E+13$ ions/cm$^2$ and $6.2E+13$ ions/cm$^2$, but not limited thereto. In addition, the implantation process 91 in this embodiment may be performed on the entire top surface of the amorphous silicon layer 20, but the present invention is not limited to this. In other embodiments of the present invention, the implantation process 91 may be performed locally on the amorphous silicon layer 20 by employing a patterned mask layer (not shown in FIGS. 1-6) on the amorphous silicon layer 20 for example, but not limited thereto.

As shown in FIGS. 1-3, in step S4, an annealing treatment 92 is performed on the amorphous silicon layer 20 after the implantation process 91. The annealing treatment 92 may include a flash annealing treatment, a laser spike annealing treatment, or other appropriate annealing treatments. In this embodiment, a full width at half maximum (FWHM) of a pulse peak of the annealing treatment 92 may range between 1 millisecond (ms) and 2.5 ms, and an annealing temperature of the annealing treatment 92 may ranges between 900° C. and 1350° C. preferably, but the present invention is not limited to this. For example, in a flash rapid thermal processing (RTP), a FWHM of a pulse peak may be about 1.4 ms, and the peak temperature may be about 1100° C. In other embodiments of the present invention, other annealing treatments with other ranges of annealing time and annealing temperature may also be applied.

In this embodiment, a distance between a top surface of the fin 10F and a top surface of the amorphous silicon layer 20 is regarded as a thickness TK of the amorphous silicon layer 20. After the implantation process 91 and the annealing treatment 92 mentioned above, a doped region 20D may be formed in the amorphous silicon layer 20. An implantation depth DP of the doped region 20D in the amorphous silicon layer 20 is less than the thickness TK of the amorphous silicon layer 20 preferably. For example, the thickness TK of the amorphous silicon layer 20 may range between 1000 angstroms and 1500 angstroms, and the implantation depth DP in the amorphous silicon layer 20 may range between 300 angstroms and 800 angstroms. The grain size distribution of the amorphous silicon layer 20 may become more uniform after the implantation process 91 and the annealing treatment 92 in this embodiment. It is worth noting that, in this embodiment, the annealing treatment 92 may be performed on the entire top surface of the amorphous silicon layer 20, but the present invention is not limited to this. In other embodiments of the present invention, the annealing treatment 92 may be performed locally on specific regions such as alignment regions containing alignment marks, but not limited thereto.

As shown in FIG. 1, and FIGS. 4-6, in step S5, a hard mask layer 30 is then formed on the amorphous silicon layer 20 after the annealing treatment described above. In step S6, the hard mask layer 30 is then patterned for forming a patterned hard mask layer 30P on the amorphous silicon layer 20. The hard mask layer 30 may be a single layer or a multiple layer structure. For example, the hard mask layer 30 in this embodiment may include a first hard mask layer 31 and a second hard mask layer 32 stacked with each other. The first hard mask layer 31 and the second hard mask layer 32 may be composed of different materials such as silicon nitride and silicon oxide respectively, but not limited thereto. The hard mask layer 30 may be patterned by appropriate approaches. For example, the patterned hard mask layer 30P in this embodiment may be formed by a sidewall image transfer (SIT) process, but the present invention is not limited to this. In other embodiments of the present invention, the patterned hard mask layer 30P may also be formed by other processes such as a traditional photolithography process.

For performing the SIT process, a mandrel layer 40 and a mask layer 50 may be sequentially formed on the hard mask layer 30, but not limited thereto. The mask layer 50 is used for patterning the mandrel layer 40. The mask layer 50 may be a single layer or a multiple layer structure. For example, the mask layer 50 in this embodiment may include an organic dielectric layer (ODL) 51, a silicon-containing hard mask bottom anti-reflecting coating (SHB) 52, and a patterned photoresist 53, but not limited thereto. In other embodiments of the present invention, other required material layers may also be applied for performing other different kinds of SIT process. In this embodiment, the patterned photoresist 53 has to be formed on the amorphous silicon layer 20, the hard mask layer 30, the mandrel layer 40, the ODL 51, and the SHB 52 stacked with one another. In an exposure process for forming the patterned photoresist 53, alignment marks (not shown) under the amorphous silicon layer 20 are used to coordinate exposure positions. The measurement of the alignment marks may be influenced by the amorphous silicon layer 20 especially when the grain size is not uniform in the amorphous silicon layer 20. However, the amorphous silicon layer 20 in this embodiment is treated by the implantation process and the annealing process mention above, and the grain size distribution of the amorphous silicon layer 20 will become more uniform for improving the measurement condition of the alignment marks. Indexes of the measurement such as wafer quality (WQ) and residual of process indicator (ROPI) will be improved accordingly no matter what kinds of the light source is used in the measurement, such as a near infrared (NIR, with wavelength ranges between 0.8 um and 1.5 um) light source or a far infrared (FIR, with wavelength ranges between 15 um and 1000 um) light source. For example, the WQ will be about 0.32 and the ROPI will be about 5.17 nm when the amorphous silicon layer 20 is not treated by the implantation process and the annealing process. When the amorphous silicon layer 20 is treated by the implantation process and the annealing process in this embodiment, the WQ will be improved to about 0.93 and the ROPI will be less than 4.5 nm. The alignment accuracy (AA) of the patterned photoresist 53 may also be improved to about 5.26 nm for example, but not limited thereto.

As shown in FIGS. 4-6, sidewall spacers 41 are formed on sidewalls of the mandrel layer 40 which is patterned by the mask layer 50, and the patterned hard mask layer 30P is defined by the sidewall spacers 41. As shown in FIG. 1, FIG. 6, and FIG. 7, the amorphous silicon layer 20 is then patterned with the patterned hard mask layer 30P for forming at least one dummy gate 20G on the semiconductor substrate 10. In other words, the patterned hard mask layer 30P may be used to define the dummy gate 20G on the fins 10F, but the present invention is not limited to this. In other embodiments of the present invention, the patterned hard mask layer 30P on the amorphous silicon layer 20 may also be used to define other patterned structures on the semiconductor substrate 10.

Figure 8:
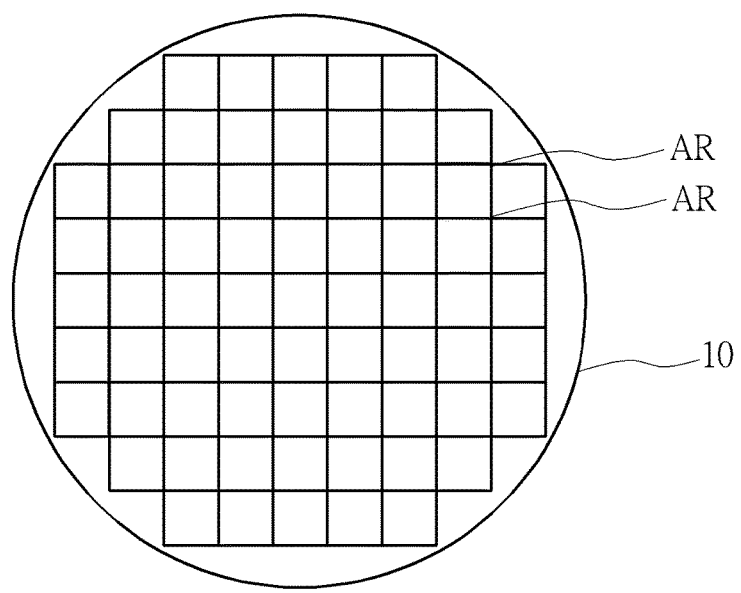
FIG. 8, FIG. 9, and FIG. 10 are schematic drawings illustrating a method of forming a patterned hard mask layer according to another embodiment of the present invention.
Figure 9:
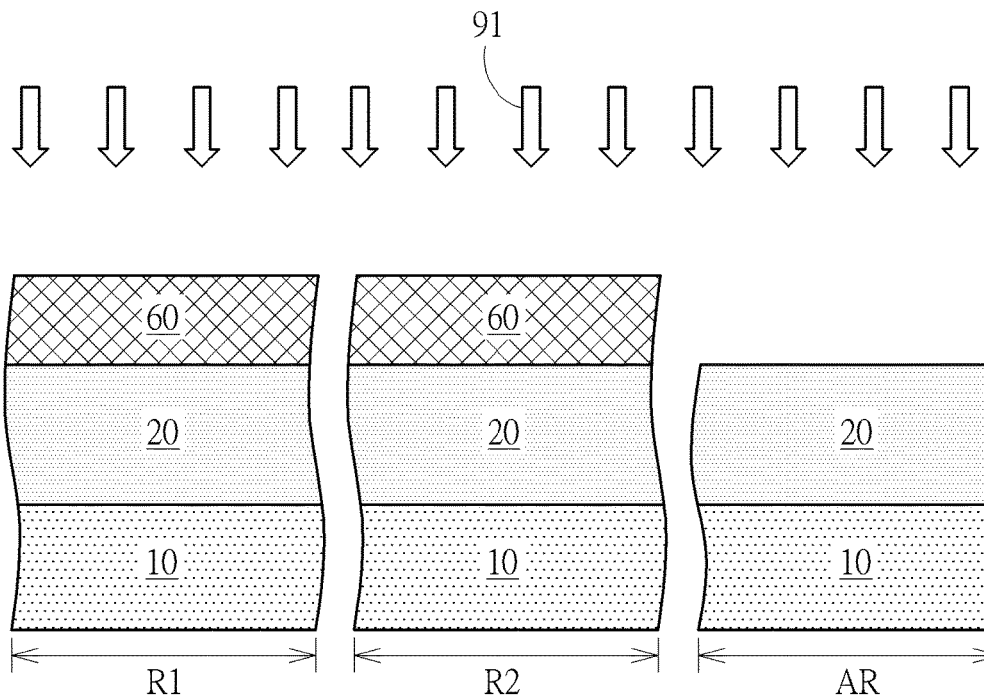
Figure 10:
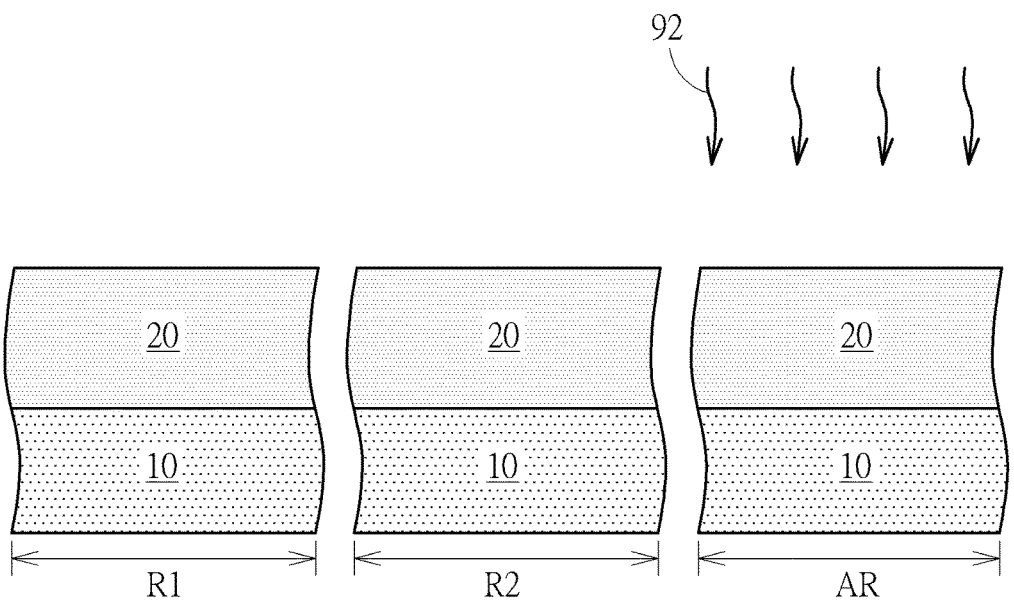

Please refer to FIGS. 8-10. FIGS. 8-10 are schematic drawings illustrating a method of forming a patterned hard mask layer according to another embodiment of the present invention. In this embodiment, the implantation process 91 may be performed only on alignment regions AR containing alignment marks (not shown) on the semiconductor substrate 10 by employing a patterned mask layer 60 covering other device regions such as an NMOS region R1 and/or a PMOS region R2. Additionally, the annealing treatment 92 may be a laser spike annealing treatment for locally annealing the alignment regions AR on the semiconductor substrate 10. In other words, the annealing treatment 92 may also be performed only on the annealing alignment regions AR. Other regions such as the NMOS region R1 and/or the PMOS region R2 will not be treated by the implantation process 91 and/or the annealing treatment 92 preferably. In other words, in another embodiment of the present invention, the annealing treatment 92 may be performed locally on the alignment regions AR only and the implantation process 91 may be performed on the entire top surface of the amorphous silicon layer 20. In further another embodiment of the present invention, the implantation process 91 may be performed locally on the alignment regions AR only and the annealing treatment 92 may be performed on the entire top surface of the amorphous silicon layer 20.

To summarize the above descriptions, in the method of forming the patterned hard mask layer in this invention, the grain size distribution of the amorphous silicon layer becomes more uniform after being treated by the implantation process and the annealing treatment. The measurement of the alignment marks under the amorphous silicon layer may become easier and more precise, and the alignment accuracy of the lithography process on the treated amorphous silicon layer may be improved accordingly. Additionally, the implantation process and/or the annealing treatment may be performed locally on the alignment regions without influencing other regions on the semiconductor substrate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a patterned hark mask layer, comprising:
    providing a semiconductor substrate;
    forming an amorphous silicon layer on the semiconductor substrate;
    performing an implantation process on the amorphous silicon layer, wherein the implantation process is performed only on alignment regions on the semiconductor substrate;
    performing an annealing treatment on the amorphous silicon layer after the implantation process; and
    forming a patterned hard mask layer on the amorphous silicon layer after the annealing treatment.

2. The method of claim 1, wherein the implantation process includes a boron implantation process, a germanium implantation process, an arsenic implantation process, or a phosphorous implantation process.

3. The method of claim 1, wherein ion energy of the implantation process ranges between 13 kV and 40 kV.

4. The method of claim 1, wherein an ion dose of the implantation process ranges between 1.0E+13 ions/cm$^2$ and 6.2E+13 ions/cm$^2$.

5. The method of claim 1, wherein a thickness of the amorphous silicon layer ranges between 1000 angstroms and 1500 angstroms, and an implantation depth in the amorphous silicon layer ranges between 300 angstroms and 800 angstroms.

6. The method of claim 1, wherein the annealing treatment comprises a flash annealing treatment and/or a laser spike annealing treatment.

7. The method of claim 1, wherein the annealing treatment comprises a laser spike annealing treatment for locally annealing alignment regions on the semiconductor substrate.

8. The method of claim 1, wherein a full width at half maximum (FWHM) of a pulse peak of the annealing treatment ranges between 1 millisecond (ms) and 2.5 ms, and an annealing temperature of the annealing treatment ranges between 900° C. and 1350° C.

9. The method of claim 1, wherein the step of forming the patterned hark mask layer comprises:
    forming a hard mask layer on the amorphous silicon layer after the annealing treatment; and
    patterning the hard mask layer for forming the patterned hard mask layer on the amorphous silicon layer.

10. The method of claim 9, wherein the patterned hard mask layer is formed by a sidewall image transfer (SIT) process.

11. The method of claim 1, further comprising:
    patterning the amorphous silicon layer with the patterned hard mask layer for forming at least one dummy gate on the semiconductor substrate.

12. The method of claim 1, wherein the semiconductor substrate comprises at least one fin, and the amorphous silicon layer is formed on the fin.

* * * * *